United States Patent
Chin

(10) Patent No.: US 12,382,602 B2
(45) Date of Patent: Aug. 5, 2025

(54) ELECTRONIC DEVICE AND SUPPORTING STRUCTURE THEREOF

(71) Applicant: Wistron Corp., New Taipei (TW)

(72) Inventor: Hao Chin, New Taipei (TW)

(73) Assignee: Wistron Corp., New Taipei (TW)

( * ) Notice: Subject to any disclaimer, the term of this patent is extended or adjusted under 35 U.S.C. 154(b) by 399 days.

(21) Appl. No.: 18/059,815

(22) Filed: Nov. 29, 2022

(65) Prior Publication Data

US 2024/0081016 A1 Mar. 7, 2024

(30) Foreign Application Priority Data

Sep. 6, 2022 (TW) ................... 111133630

(51) Int. Cl.
*H05K 7/14* (2006.01)
*H05K 7/20* (2006.01)

(52) U.S. Cl.
CPC ....... *H05K 7/1487* (2013.01); *H05K 7/20154* (2013.01); *H05K 7/20727* (2013.01)

(58) Field of Classification Search
CPC .. H05K 5/03; H05K 5/05; H05K 5/15; H05K 5/0213; H05K 5/30; H05K 7/12; H05K 7/14; H05K 7/1422; H05K 7/20136–20181; H05K 2201/10431; H05K 2201/10454; H05K 2201/105
See application file for complete search history.

(56) References Cited

U.S. PATENT DOCUMENTS

| | | | | |
|---|---|---|---|---|
| 4,962,442 A * | 10/1990 | Clemens | ................ | H05K 3/301 361/767 |
| 5,373,104 A * | 12/1994 | Brauer | ................ | H05K 7/1417 206/508 |
| 5,786,985 A * | 7/1998 | Taniguchi | ........... | H01L 23/4951 257/E21.705 |
| 6,349,908 B1 * | 2/2002 | Rushansky | ............. | H05K 7/12 248/694 |
| 6,921,973 B2 * | 7/2005 | Kataria | ................ | H01L 23/433 257/713 |
| 6,967,846 B2 * | 11/2005 | Chen | .................... | H05K 7/1427 174/386 |
| 9,781,831 B2 * | 10/2017 | Hao | .................... | H05K 7/1485 |
| 9,832,905 B2 * | 11/2017 | Rivnay | ................ | H05K 7/1485 |
| 10,905,024 B1 * | 1/2021 | Fu | ......................... | H05K 7/1487 |
| 11,382,223 B2 * | 7/2022 | Mueller | ................ | H05K 7/1417 |
| 2014/0247554 A1 * | 9/2014 | Sharma | .................... | H01F 27/02 312/223.1 |
| 2015/0145390 A1 * | 5/2015 | Schwab | ............ | H01L 21/67333 312/293.3 |
| 2015/0201505 A1 * | 7/2015 | Hu | ........................... | H05K 5/03 312/223.1 |

(Continued)

FOREIGN PATENT DOCUMENTS

TW I300688 B 9/2008

*Primary Examiner* — Anthony Q Edwards

(57) ABSTRACT

An electronic device is provided. The electronic device includes a case, a substrate, a first supporter and a first spacer. The substrate is disposed in the case. The first supporter is affixed to the substrate. The first supporter includes a supporter connection unit. The first spacer is detachably connected to the first supporter. The first spacer includes a spacer connection unit. The supporter connection unit is connected to the spacer connection unit.

17 Claims, 8 Drawing Sheets

(56) References Cited

U.S. PATENT DOCUMENTS

| | | | | |
|---|---|---|---|---|
| 2016/0295724 A1* | 10/2016 | Fujii | ................... | H05K 5/0052 |
| 2018/0092255 A1* | 3/2018 | Rojahn | ................. | H05K 5/006 |
| 2020/0229311 A1* | 7/2020 | Wu | ..................... | H05K 7/1487 |
| 2021/0176877 A1* | 6/2021 | Miyake | ............... | H05K 5/0221 |
| 2021/0209718 A1* | 7/2021 | Song | .................... | H05K 5/0026 |
| 2021/0352815 A1* | 11/2021 | Kraemer | ............. | H05K 5/0052 |
| 2021/0392769 A1* | 12/2021 | Slawik | ................. | F16B 21/071 |
| 2022/0061171 A1* | 2/2022 | Dvorak | ............... | H05K 5/0052 |
| 2022/0225533 A1* | 7/2022 | Ritter | ................ | H05K 7/20145 |
| 2023/0103941 A1* | 4/2023 | Tsorng | ................ | H05K 7/1487 |
| | | | | 361/679.01 |
| 2024/0431039 A1* | 12/2024 | Fujimori | ................. | H04B 5/00 |

* cited by examiner

ELECTRONIC DEVICE AND SUPPORTING STRUCTURE THEREOF

CROSS REFERENCE TO RELATED APPLICATIONS

This application claims priority of Taiwan Patent Application No. 111133630, filed on Sep. 6, 2022, the entirety of which is incorporated by reference herein.

BACKGROUND OF THE INVENTION

Field of the Invention

The present invention relates to an electronic device, and in particular to an electronic device with a substrate and a supporter.

Description of the Related Art

In a conventional server, a supporter is affixed to the motherboard, and the supporter is utilized to support a wind cover. However, commercially available servers come in different sizes (for example, 1 U and 2 U). In a sever with a higher case (such as 2 U), a higher supporter is required. In a sever with a lower case (such as 1 U), a lower supporter is required. The motherboard and the supporter utilized in a 2 U server cannot be utilized in a 1 U server. Therefore, cost of manufacturing the supporter and the motherboard is increased, and manufacturing efficiency is decreased.

BRIEF SUMMARY OF THE INVENTION

Embodiments of the invention are provided to address the aforementioned difficulty.

In one embodiment, an electronic device is provided. The electronic device includes a case, a substrate, a first supporter and a first spacer. The substrate is disposed in the case. The first supporter is affixed to the substrate. The first supporter comprises a supporter connection unit. The first spacer is detachably connected to the first supporter. The first spacer comprises a spacer connection unit. The supporter connection unit is connected to the spacer connection unit.

In one embodiment, the first supporter is located between the first spacer and the substrate, and the first spacer is connected to the case.

In one embodiment, the electronic device further comprises a second supporter and a second spacer. The second supporter is affixed to the substrate. The second spacer is detachably connected to the second supporter, wherein the second supporter is located between the second spacer and the substrate.

In one embodiment, the electronic device further comprises a wind cover. The wind cover is adapted to be disposed on the first spacer and the second spacer. The wind cover is selectively disposed on the first supporter and the second supporter or disposed on the first spacer and the second spacer.

In one embodiment, the second spacer is connected to the case.

In one embodiment, the electronic device further comprises a heat source and a heat sink, the heat source is disposed on the substrate, the heat sink is disposed on the heat source, a space is formed between the wind cover and the substrate, and the heat source and the heat sink are disposed between the wind cover and the substrate.

In one embodiment, the first spacer further comprises a spacer body, the spacer connection unit is formed on an edge of the spacer body, and the spacer connection unit is adapted to be wedged against the supporter connection unit.

In one embodiment, at least one of the spacer connection units comprises a spacer unit wedging portion, at least one of the supporter connection units comprises a supporter unit wedging portion, and the spacer unit wedging portion is wedged against the supporter unit wedging portion.

In one embodiment, the spacer connection unit comprises at least one first tooth and at least one second tooth, the first tooth is arranged along a first straight line, the second tooth is arranged along a second straight line, and the first line is parallel to the second line.

In one embodiment, the length of the first tooth is longer than the length of the second tooth, and a spacer guiding surface is formed on the first tooth.

In one embodiment, the first spacer further comprises a plurality of enhancement ribs, and the enhancement ribs are formed on the spacer body and are corresponding to the spacer connection unit.

In one embodiment, the first spacer further comprises a spacer wedging portion, the case comprises a case wedging portion and the spacer wedging portion is adapted to be wedged against the case wedging portion.

In one embodiment, the spacer wedging portion comprises a latch, the case wedging portion comprises a recess, and the latch is adapted to be inserted into the recess.

In one embodiment, the first spacer further comprises a spacer abutting arm, and the spacer abutting arm is adapted to abut the case.

In one embodiment, the electronic device further comprises a wind cover, wherein the wind cover is connected to the first spacer, the first spacer is located between the wind cover and the first supporter, the first spacer comprises a spacer connection portion, the wind cover comprises a cover connection portion, and the cover connection portion is connected to the spacer connection portion.

In one embodiment, the spacer connection portion comprises a notch, the cover connection portion comprises a protruding rib, and the protruding rib is adapted to be inserted into the notch.

In one embodiment, the wind cover further comprises a guiding rib, the guiding rib is formed on the wind cover and corresponding to the protruding rib, and an extending direction of the guiding rib is perpendicular to an extending direction of the protruding rib.

In another embodiment, a supporting structure is provided. The supporting structure is adapted to be utilized to an electronic device. The supporting structure includes a substrate, a first supporter and a first spacer. The first supporter is affixed to the substrate, wherein the first supporter comprises a supporter connection unit. The first spacer is detachably connected to the first supporter, wherein the first spacer comprises a spacer connection unit, and the supporter connection unit is connected to the spacer connection unit.

In servers with a higher case (for example, the 2 U server of the first embodiment), the spacer of the embodiment of the invention is combined with the supporter to provide sufficient supporting height. In servers with a lower case (for example, the 1 U server of the second embodiment), the spacer is omitted. The supporters and the motherboards of the embodiment of the invention can be commonly utilized in the 2 U server and the 1 U server. Therefore, the electronic devices of different specifications can utilize the supporters and the motherboards of the same sizes. The manufacturing cost is reduced, and the manufacturing efficiency is improved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
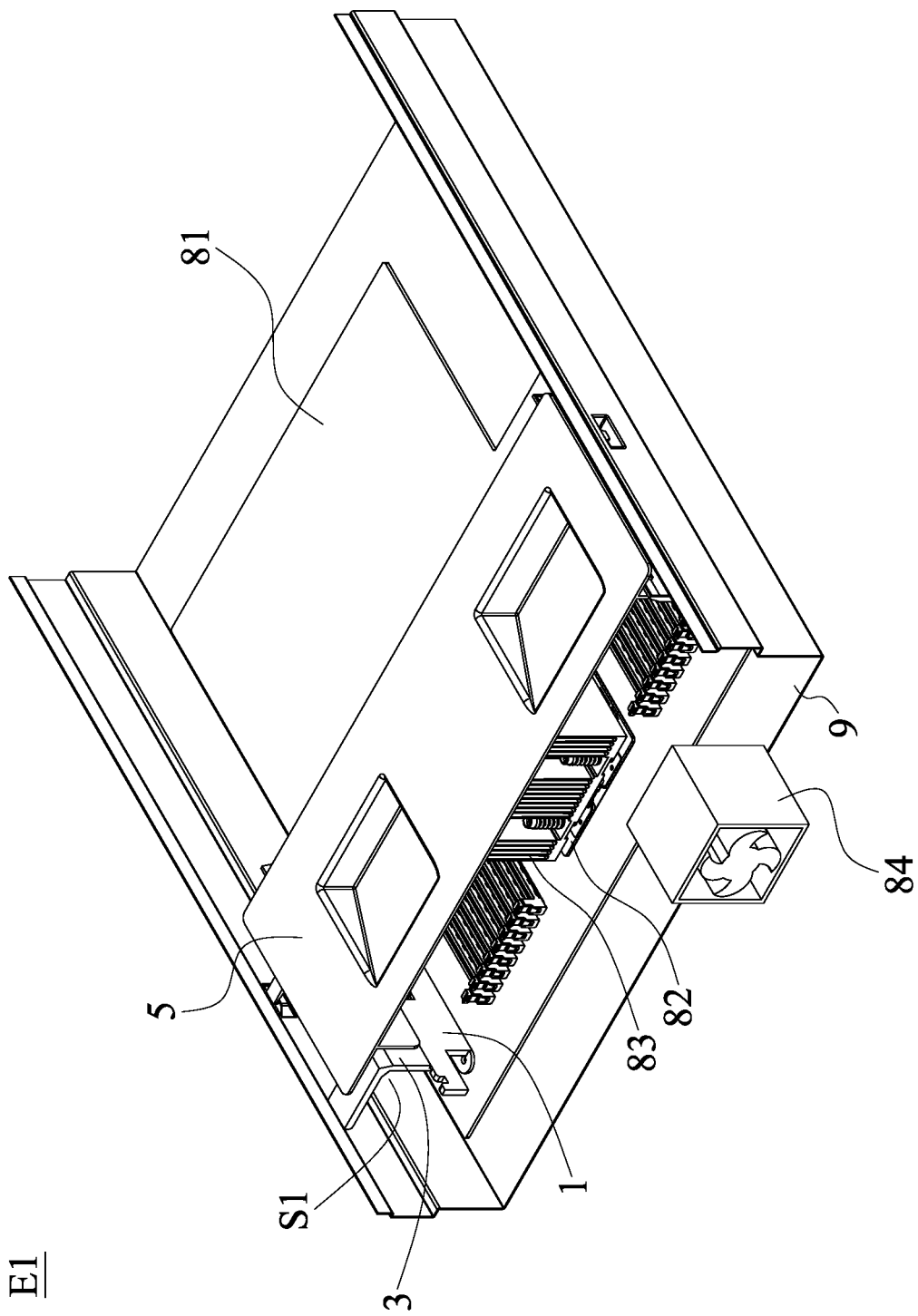
FIG. 1A is a perspective view of the electronic device of a first embodiment of the invention.
Figure 1B:
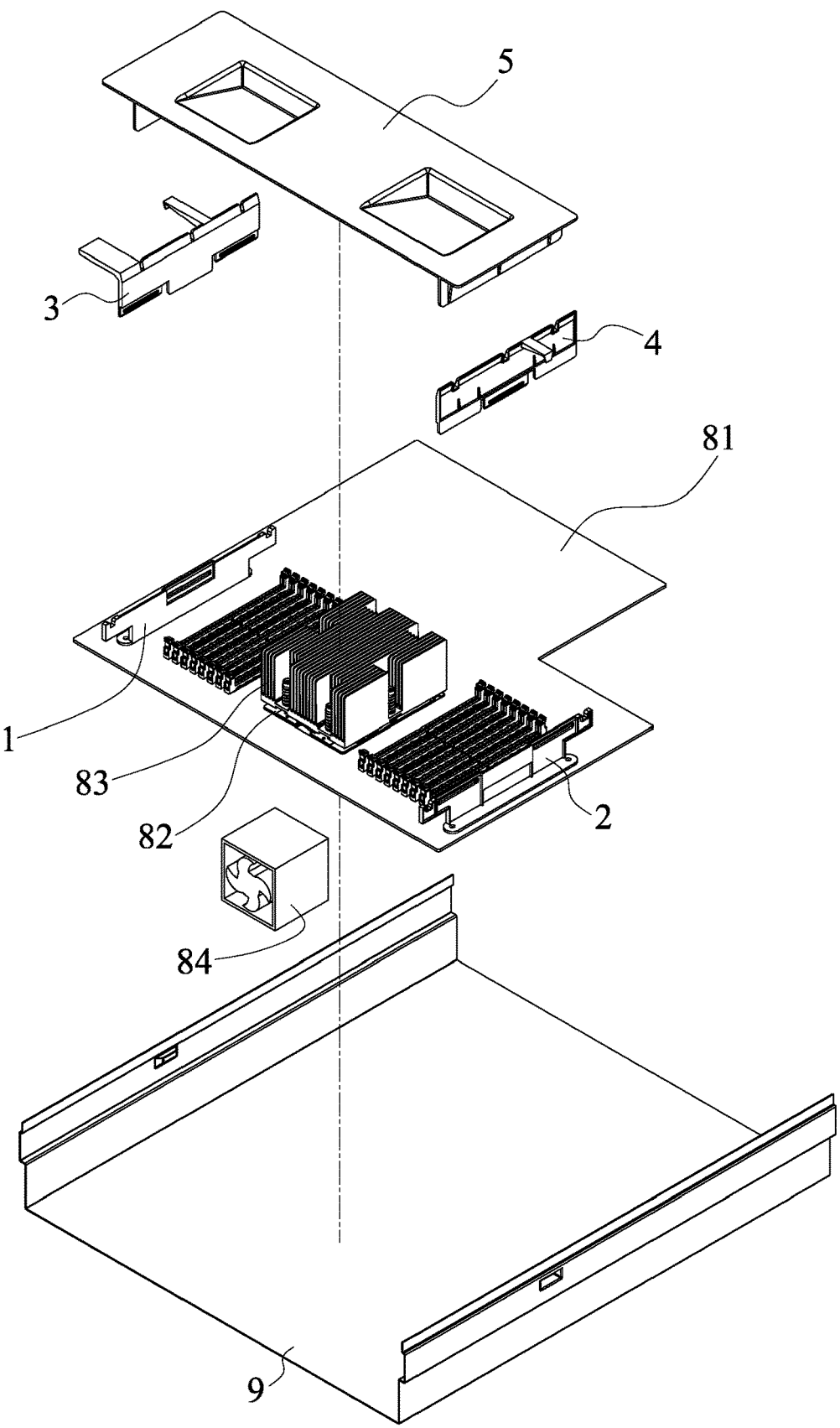
FIG. 1B is an exploded view of the electronic device of the first embodiment of the invention.

FIG. 1A is a perspective view of the electronic device of a first embodiment of the invention. FIG. 1B is an exploded view of the electronic device of the first embodiment of the invention. With reference to FIGS. 1A and 1B, the electronic device E1 of the first embodiment of the invention includes a case 9, a substrate 81, a first supporter 1 and a first spacer 3. The substrate 81 is disposed in the case 9. The first supporter 1 is affixed to the substrate 81. The first spacer 3 is detachably connected to the first supporter 1. The first supporter 1 is located between the first spacer 3 and the substrate 81.

In one embodiment, the substrate 81 can be a motherboard. The electronic device can be a server or other electronic device. The disclosure is not meant to restrict the invention.

With reference to FIGS. 1A and 1B, in one embodiment, the first spacer 3 is connected to the case 9. A first space S1 is formed between the first spacer 3 and the case 9.

With reference to FIGS. 1A and 1B, in one embodiment, the electronic device further comprises a second supporter 2 and a second spacer 4 and a wind cover 5. The second supporter 2 is affixed to the substrate 81. The second spacer 4 is detachably connected to the second supporter 2. The second supporter 2 is located between the second spacer 4 and the substrate 81. The wind cover 5 is disposed on the first spacer 3 and the second spacer 4.

Figure 2:
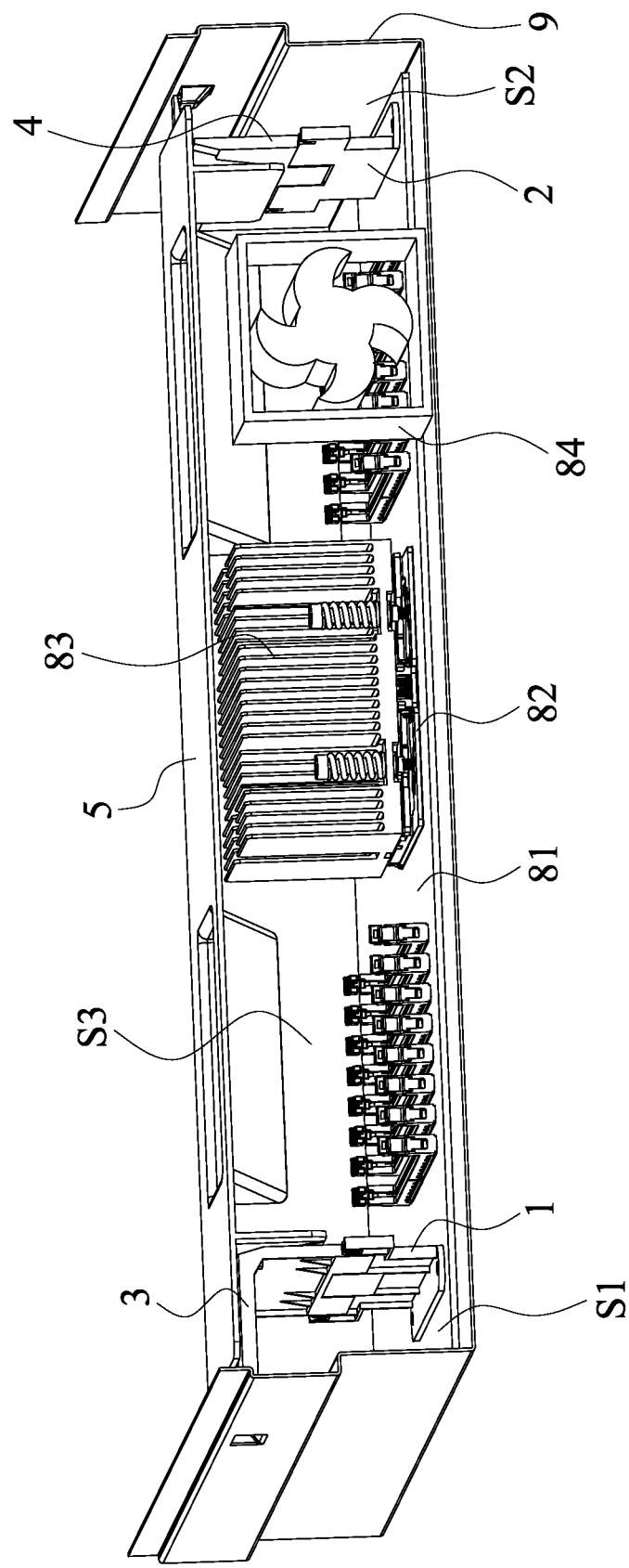
FIG. 2 is an assembled view of the electronic device of the first embodiment of the invention.

FIG. 2 is an assembled view of the electronic device of the first embodiment of the invention. With reference to FIGS. 1B and 2, in one embodiment, the second spacer 4 is connected to the case 9. A second space S2 is formed between the second spacer 4 and the case 9.

With reference to FIGS. 1A, 1B and 2, in one embodiment, the electronic device further comprises a heat source 82 and a heat sink 83. The heat source 82 is disposed on the substrate 81. The heat sink 83 is disposed on the heat source 82. A third space S3 is formed between the wind cover 5 and the substrate 81. The heat source 82 and the heat sink 83 are disposed in the third space S3. The electronic device further comprises a blower 84. The blower 84 provides an air flow toward the third space S3 to remove heat. In the embodiment of the invention, the third space S3 allows the air flow to passing through. The first space S1 and the second space S2 allow cables to passing through. The cables (not shown) inside the electronic device can pass through the first space S1 or the second space S2, and the cables (not shown) are tidily arranged. Additionally, the heat dissipation efficiency inside the electronic device is improved.

Figure 3A:
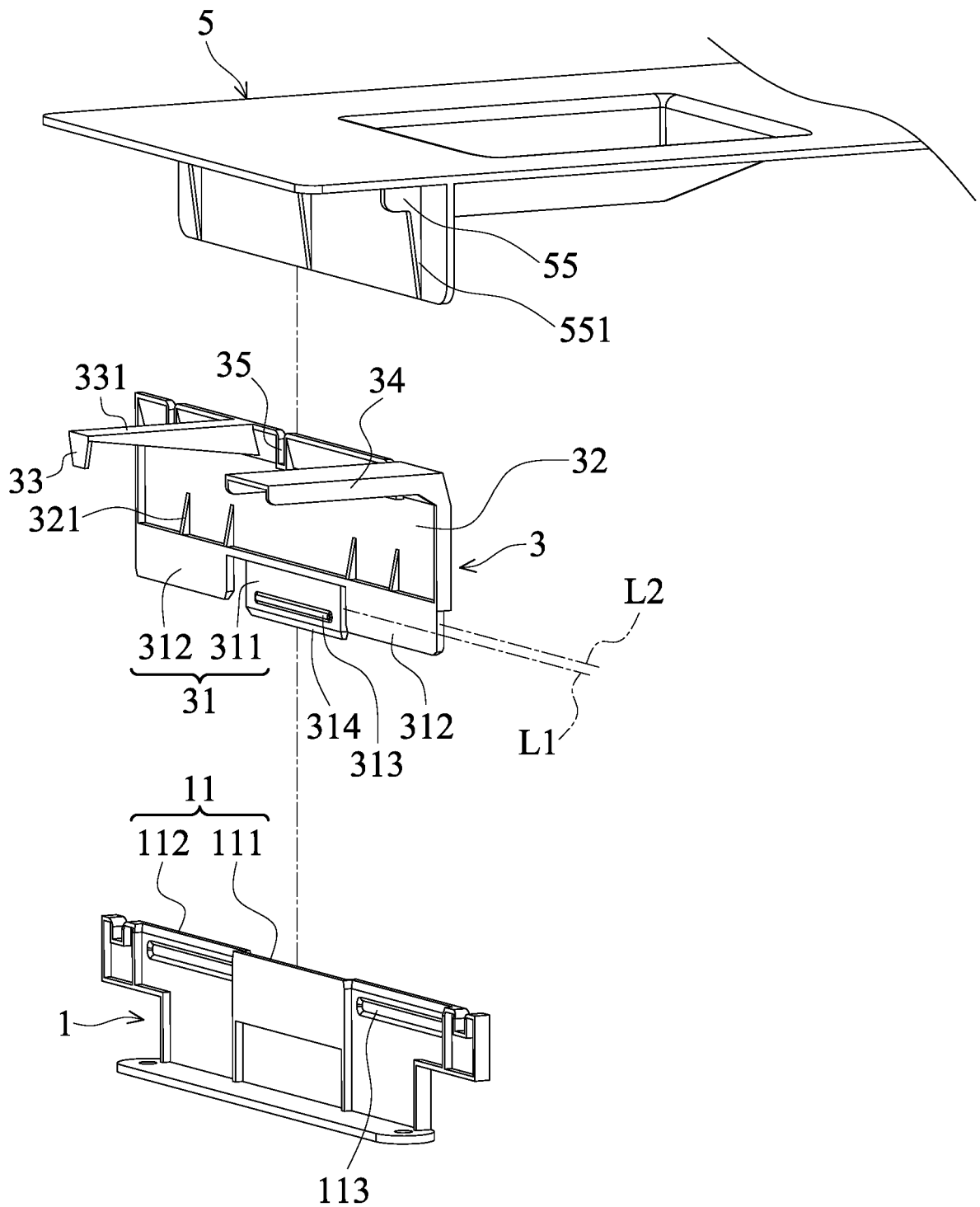
FIGS. 3A and 3B show the details of the first spacer of the embodiment of the invention.
Figure 3B:
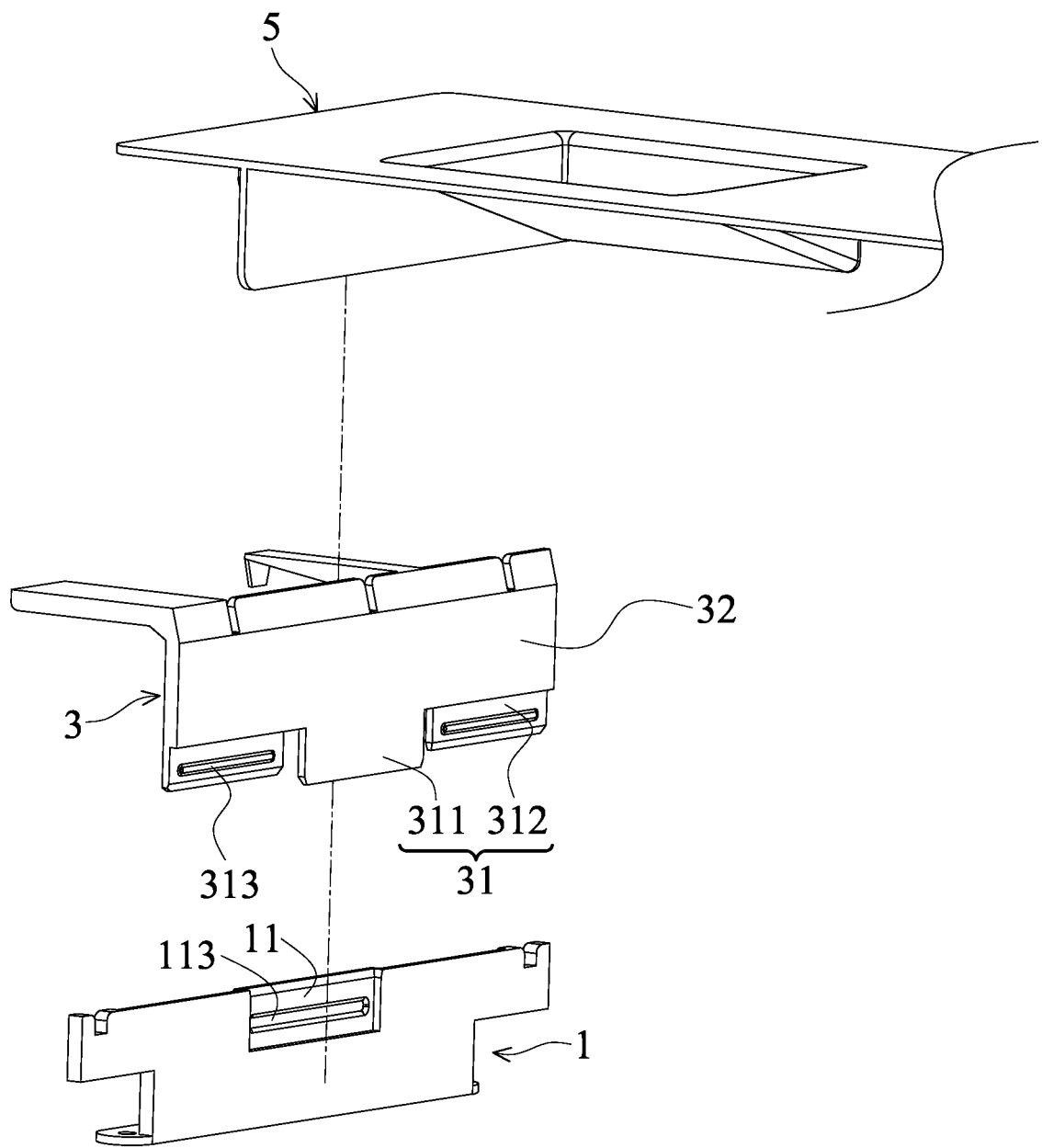

FIGS. 3A and 3B show the details of the first spacer of the embodiment of the invention. With reference to FIGS. 3A and 3B, in one embodiment, the first spacer 3 comprises a spacer body 32 and a plurality of spacer connection units 31. The spacer connection units 31 are formed on an edge of the spacer body 32. The spacer connection units 31 are arranged in a staggered manner. The first supporter 1 comprises a plurality of supporter connection units 11. The supporter connection units 11 are arranged in a staggered manner. The spacer connection units are adapted to be wedged against the supporter connection units. In the embodiment of the invention, the supporter connection units 11 are arranged in a staggered manner, and the thicknesses of the spacer and the supporter are decreased, and the first space and the second space (cable arrangement spaces) are increased.

With reference to FIGS. 3A and 3B, in one embodiment, at least one spacer connection units 31 comprises a spacer unit wedging portion 313. At least one of the supporter connection units 11 comprises a supporter unit wedging portion 113. The spacer unit wedging portion 313 is wedged against the supporter unit wedging portion 113.

With reference to FIGS. 3A and 3B, in one embodiment, the spacer connection unit 31 comprises at least one first tooth 311 and at least one second tooth 312. The first tooth 311 is arranged along a first straight line L1. The second tooth 312 is arranged along a second straight line L2. The first line L1 is parallel to the second line L2. The first tooth 311 and the second tooth 312 are corresponding to a first slot 111 and the second slot 112 of the supporter connection units 11.

With reference to FIGS. 3A and 3B, in one embodiment, the length of the first tooth 311 is longer than the length of the second tooth 312. A spacer guiding surface 314 is formed on the first tooth 311. The first tooth 311 is wedged against to the supporter connection units 11 via the guiding of the spacer guiding surface 314.

With reference to FIG. 3A, in one embodiment, the first spacer 3 further comprises a plurality of enhancement ribs 321. The enhancement ribs 321 are formed on the spacer body 32 and are corresponding to the spacer connection unit 31. The enhancement ribs 321 increases the strength of the spacer connection units 31.

Figure 4:
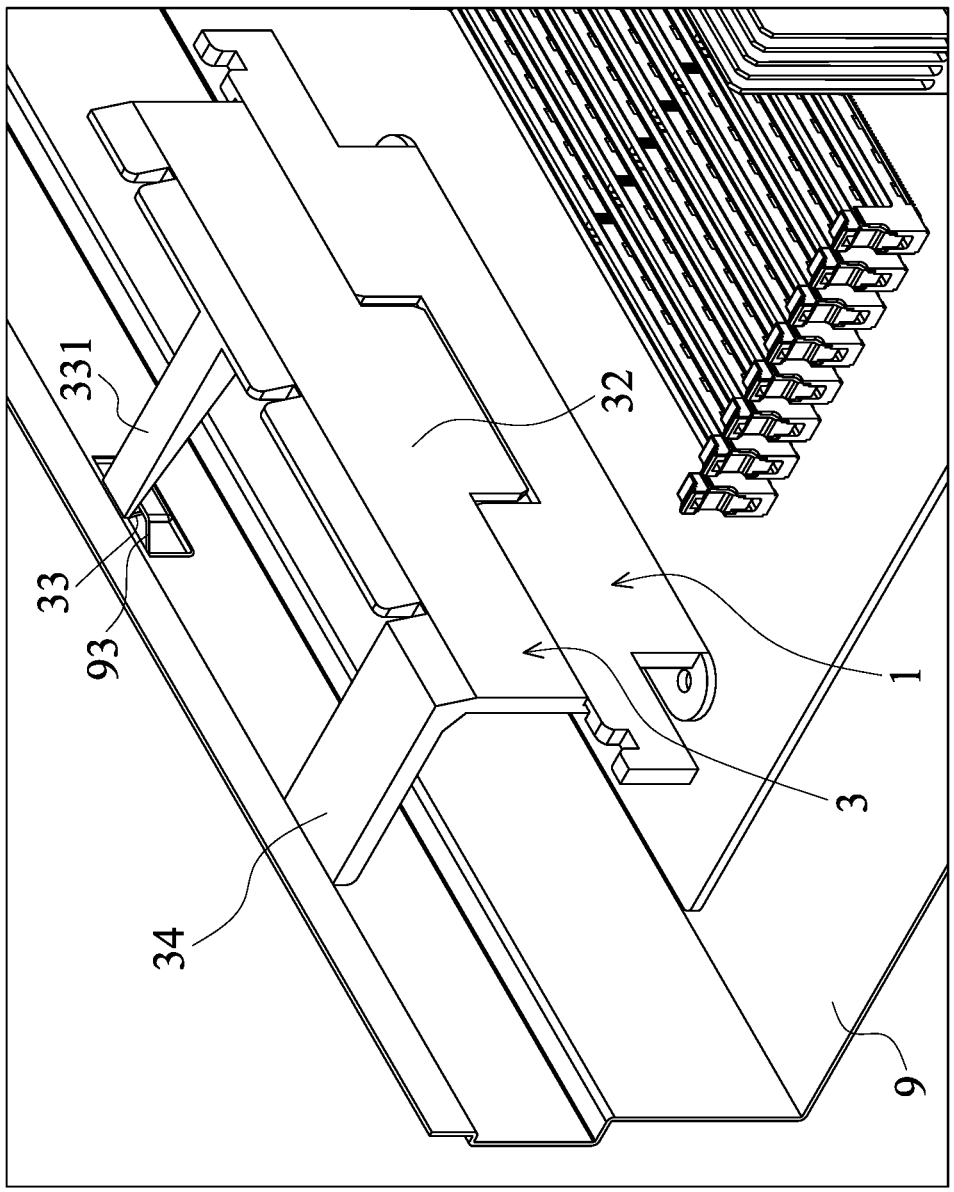
FIG. 4 shows the first spacer of the embodiment of the invention connected to the case.

FIG. 4 shows the first spacer of the embodiment of the invention connected to the case. With reference to FIGS. 3A and 4, in one embodiment, the first spacer 3 further comprises a spacer wedging portion 33. The case 9 comprises a case wedging portion 93. The spacer wedging portion 33 is adapted to be wedged against the case wedging portion 93.

With reference to FIGS. 3A and 4, in one embodiment, the spacer wedging portion 33 comprises a latch. The case wedging portion 93 comprises a recess. The latch (33) is adapted to be inserted into the recess (93). In this embodiment, the first spacer 3 further comprises a spacer extending arm 331. The spacer wedging portion 33 is formed on a free end of the spacer extending arm 331.

With reference to FIGS. 3A and 4, in one embodiment, the first spacer 3 further comprises a spacer abutting arm 34. The spacer abutting arm 34 is adapted to abut the case 9. In this embodiment, the extending direction of the spacer extending arm 331 is parallel to the extending direction of the spacer abutting arm 34. The spacer extending arm 331 is adjacent to one end of the spacer body 32, and the spacer abutting arm 34 is adjacent to another end of the spacer body 32. In one embodiment, the case wedging portion, the spacer extending arm and the spacer abutting arm connect the spacer to the case, and the structural stability of the spacer is improved.

Figure 5:
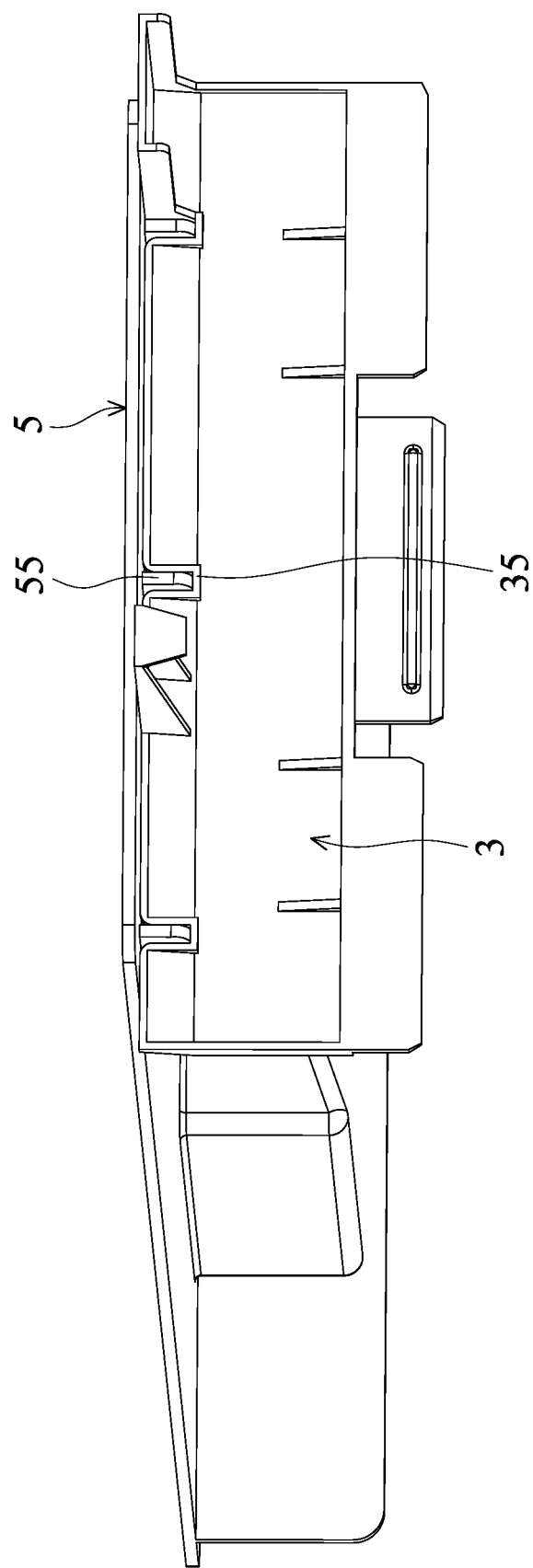
FIG. 5 shows the wind cover of the embodiment of the invention combined with the first spacer.

FIG. 5 shows the wind cover of the embodiment of the invention combined with the first spacer. With reference to FIGS. 3A and 5, in one embodiment, the wind cover 5 is connected to the first spacer 3. The first spacer 3 is located between the wind cover 5 and the first supporter 1. The first spacer 3 comprises a plurality of spacer connection portions. The wind cover 5 comprises a plurality of cover connection portions 55. The cover connection portions 55 are connected to the spacer connection portions 35.

With reference to FIGS. 3A and 5, in one embodiment, the spacer connection portion 35 is a notch (35), the cover connection portion 55 is a protruding rib (55), and the protruding rib (55) is adapted to be inserted into the notch (35).

With reference to FIGS. 3A and 5, in one embodiment, the wind cover 5 further comprises a guiding rib 551. The guiding rib 551 is formed on the wind cover 5 and corresponding to the protruding rib 55. An extending direction of the guiding rib 551 is perpendicular to an extending direction of the protruding rib 55. While the wind cover 5 being combined with the first spacer 3, the cover connection portion 55 is combined with the spacer connection portion 35 via the guiding of the guiding rib 551.

Figure 6:
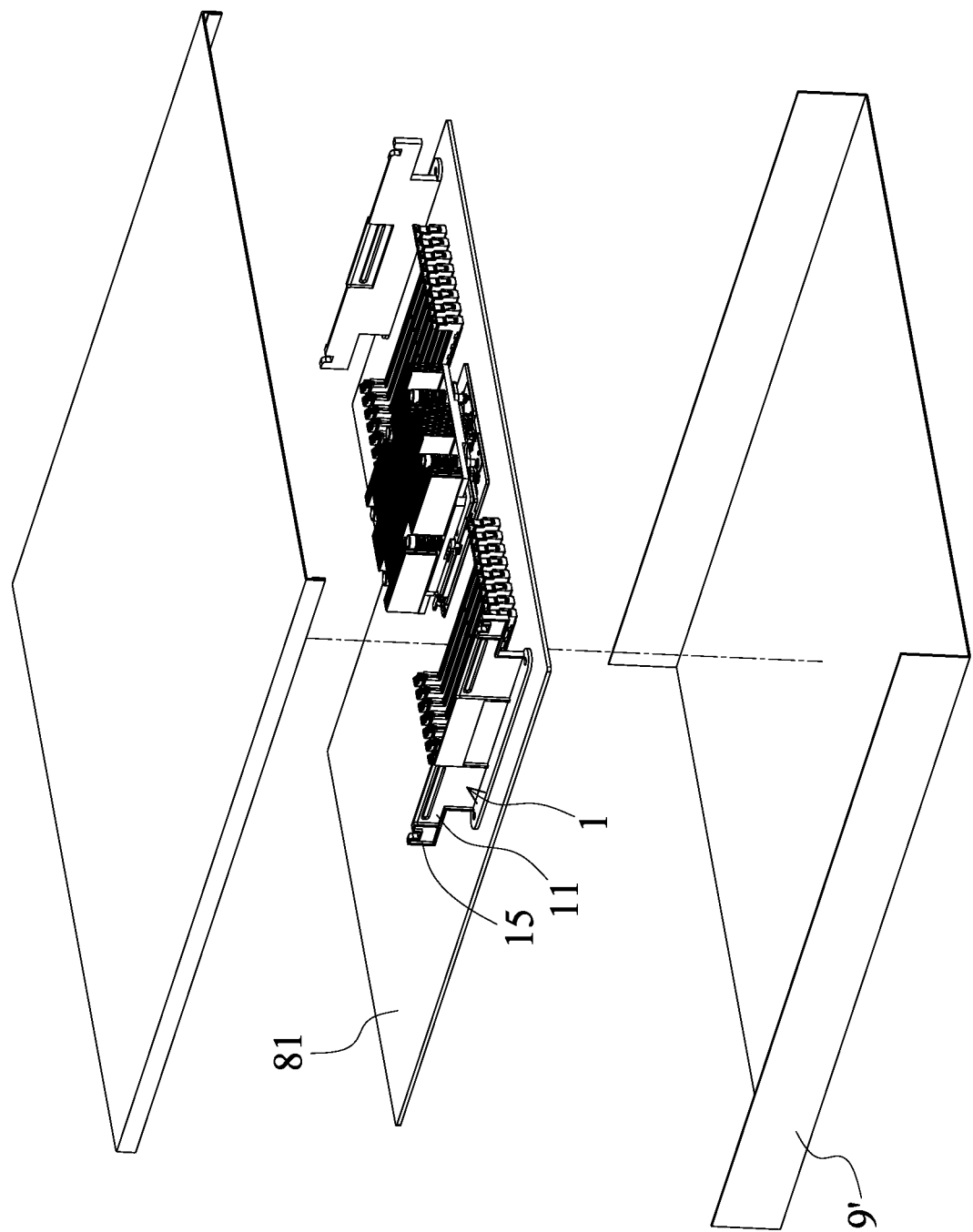
FIG. 6 is an exploded view of the electronic device of a second embodiment of the invention.

FIG. 6 is an exploded view of the electronic device of a second embodiment of the invention. With reference to FIG. 6, in this embodiment, the electronic device E2 includes a case 9', a substrate 81 and a first supporter 1. THE substrate 81 is disposed in the case 9'. The first supporter 1 is affixed to the substrate 81. The first supporter 1 includes a plurality of supporter connection units 11. The supporter connection units 11 are arranged in a staggered manner.

Compared the electronic device E1 of the first embodiment, the electronic device E2 of the second embodiment has decreased height, and the wind cover and the spacer are omitted. However, the disclosure is not meant to restrict the invention. In another embodiment, the electronic device E2 can include a wind cover (not shown in FIG. 6). In a first connection state, the first supporter 1 is directly connected to the wind cover. In one embodiment, the first supporter 1 comprises a supporter connection portion 15. A cover connection portion (for example, protruding rib, not shown in FIG. 6) is adapted to be connected to the supporter connection portion 15. The supporter connection portion 15 can be a notch. In one embodiment, the supporter 1 of the embodiment of the invention can be utilized to the electronic device E1 of the first embodiment and the electronic device E2 of the second embodiment. With reference to FIG. 3A (first embodiment), in a second connection state, the spacer connection units 31 are adapted to be wedged against the supporter connection units 11. The first supporter 3 is connected to the wind cover 5.

In the embodiments of the invention, the structures of the second supporter and the second spacer may be similar to that of the first supporter and the first spacer. The related description is therefore omitted. However, the disclosure is not meant to restrict the invention. In another embodiment, the structures of the second supporter and the second spacer may differ from those of the first supporter and the first spacer.

In servers with a higher case (for example, the 2 U server of the first embodiment), the spacer of the embodiment of the invention is combined with the supporter to provide sufficient supporting height. In servers with a lower case (for example, the 1 U server of the second embodiment), the spacer is omitted. The supporters and the motherboards of the embodiment of the invention can be commonly utilized in the 2 U server and the 1 U server. Therefore, the electronic devices of different specifications can utilize the supporters and the motherboards of the same sizes. The manufacturing cost is reduced, and the manufacturing efficiency is improved.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   a case;
   a substrate, disposed in the case;
   a first supporter, connected to the substrate, wherein the first supporter comprises a supporter connection unit;
   a first spacer, wherein the first spacer is detachably connected to the first supporter, the first spacer comprises a spacer connection unit, and the supporter connection unit is connected to the spacer connection unit, wherein the first supporter is located between the first spacer and the substrate;
   a second supporter, affixed to the substrate;
   a second spacer, detachably connected to the second supporter, wherein the second supporter is located between the second spacer and the substrate; and
   a wind cover, disposed in the case, wherein the wind cover is connected to the first spacer and the second spacer, and the wind cover is disposed on the first supporter and the second supporter, or disposed on the first spacer and the second spacer.

2. The electronic device as claimed in claim 1, wherein the second spacer is connected to the case, and the first spacer is connected to the case.

3. The electronic device as claimed in claim 1, further comprising a heat source and a heat sink, the heat source is disposed on the substrate, the heat sink is disposed on the heat source, and the heat source and the heat sink are disposed between the wind cover and the substrate.

4. The electronic device as claimed in claim 1, wherein the first spacer further comprises a spacer body, the spacer connection unit is formed on an edge of the spacer body, and the spacer connection unit is adapted to be wedged against the supporter connection unit.

5. The electronic device as claimed in claim 4, wherein of the spacer connection unit comprises a spacer unit wedging portion, the supporter connection unit comprises a supporter unit wedging portion, and the spacer unit wedging portion is wedged against the supporter unit wedging portion.

6. The electronic device as claimed in claim 4, wherein the spacer connection unit comprises at least one first tooth and at least one second tooth, the first tooth is arranged along a first straight line, the second tooth is arranged along a second straight line, and the first line is parallel to the second line.

7. The electronic device as claimed in claim 6, wherein a length of the first tooth is longer than a length of the second tooth, and a spacer guiding surface is formed on the first tooth.

8. The electronic device as claimed in claim 7, wherein the first spacer further comprises a plurality of enhancement ribs, and the enhancement ribs are formed on the spacer body and are corresponding to the spacer connection unit.

9. The electronic device as claimed in claim 4, wherein the first spacer further comprises a spacer wedging portion, the case comprises a case wedging portion and the spacer wedging portion is adapted to be wedged against the case wedging portion.

10. The electronic device as claimed in claim 9, wherein the spacer wedging portion comprises a latch, the case wedging portion comprises a recess, and the latch is adapted to be inserted into the recess.

11. The electronic device as claimed in claim 9, wherein the first spacer further comprises a spacer abutting arm, and the spacer abutting arm is adapted to abut the case.

12. The electronic device as claimed in claim 4, further comprising a wind cover, wherein the wind cover is connected to the first spacer, the first spacer is located between the wind cover and the first supporter, the first spacer comprises a spacer connection portion, the wind cover comprises a cover connection portion, and the cover connection portion is connected to the spacer connection portion.

13. The electronic device as claimed in claim 12, wherein the spacer connection portion comprises a notch, the cover connection portion comprises a protruding rib, and the protruding rib is adapted to be inserted into the notch.

14. The electronic device as claimed in claim 13, wherein the wind cover further comprises a guiding rib, the guiding rib is formed on the wind cover and corresponding to the protruding rib, and an extending direction of the guiding rib is perpendicular to an extending direction of the protruding rib.

15. A supporting structure, adapted to be utilized in an electronic device with a substrate, comprising:
a first supporter, affixed to the substrate, wherein the first supporter comprises a supporter connection unit; and
a first spacer, detachably connected to the first supporter, wherein the first spacer comprises a spacer connection unit, and the supporter connection unit is connected to the spacer connection unit,
wherein the first spacer further comprises a spacer body, the spacer connection unit is formed on an edge of the spacer body, the spacer connection unit is adapted to be wedged against the supporter connection unit, the spacer connection unit comprises at least one first tooth and at least one second tooth, the first tooth is arranged along a first straight line, the second tooth is arranged along a second straight line, and the first line is parallel to the second line.

16. The supporting structure as claimed in claim 15, further comprising:
a second supporter, affixed to the substrate; and
a second spacer, detachably connected to the second supporter, wherein the second supporter is located between the second spacer and the substrate.

17. The supporting structure as claimed in claim 16, further comprising a wind cover, wherein the wind cover is adapted to be disposed on the first spacer and the second spacer, and the wind cover is selectively disposed on the first supporter and the second supporter or disposed on the first spacer and the second spacer.

* * * * *